US010460778B2

United States Patent
Kim et al.

(10) Patent No.: US 10,460,778 B2
(45) Date of Patent: Oct. 29, 2019

(54) PERPENDICULAR MAGNETIC TUNNEL JUNCTION MEMORY CELLS HAVING SHARED SOURCE CONTACTS

(71) Applicant: Spin Memory, Inc., Fremont, CA (US)

(72) Inventors: Kuk-Hwan Kim, San Jose, CA (US); Dafna Beery, Palo Alto, CA (US); Gian Sharma, Fremont, CA (US); Marcin Gajek, Berkeley, CA (US); Kadriye Deniz Bozdag, Sunnyvale, CA (US); Girish Jagtiani, Santa Clara, CA (US); Eric Michael Ryan, Fremont, CA (US); Michail Tzoufras, Sunnyvale, CA (US); Amitay Levi, Cupertino, CA (US); Andrew J. Walker, Mountain View, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,040

(22) Filed: Dec. 29, 2017

(65) Prior Publication Data
US 2019/0206463 A1    Jul. 4, 2019

(51) Int. Cl.
G11C 11/00    (2006.01)
G11C 11/16    (2006.01)

(52) U.S. Cl.
CPC ........ G11C 11/161 (2013.01); G11C 11/1675 (2013.01); G11C 11/1697 (2013.01)

(58) Field of Classification Search
CPC .............. G11C 11/161; G11C 11/1675; G11C 11/1697

USPC ........................................................ 365/158
See application file for complete search history.

(56) References Cited

U.S. PATENT DOCUMENTS

| | | |
|---|---|---|
| 6,882,566 B2 | 4/2005 | Nejad et al. |
| 7,965,542 B2 | 6/2011 | Asao |
| 8,350,316 B2 | 1/2013 | Lung et al. |
| 8,946,670 B1 | 2/2015 | Park |
| 9,147,840 B2 | 9/2015 | Knobloch et al. |
| 9,245,610 B2 | 1/2016 | Kim et al. |
| 9,495,627 B1 | 11/2016 | Annunziata et al. |

(Continued)

OTHER PUBLICATIONS

Restriction Requirement from U.S. Appl. No. 15/857,410, dated Aug. 15, 2018.

(Continued)

*Primary Examiner* — Huan Hoang
(74) *Attorney, Agent, or Firm* — Zilka-Kotab, P.C.

(57) ABSTRACT

A magnetic device, according to one approach, includes: a plurality of perpendicular magnetic tunnel junction (p-MTJ) cells, each p-MTJ cell having a transistor and a magnetic tunnel junction (MTJ) sensor. Moreover, each of the transistors includes a drain terminal, a source terminal, and a gate terminal. The magnetic device also includes: a first common word line coupled to the gate terminal of each transistor in a first subset of the plurality of p-MTJ cells, a first common bit line coupled to a first end of each MTJ sensor in a second subset of the plurality of p-MTJ cells, and a first common source line coupled to the drain terminal of each transistor in the first subset. A second end of each of the MTJ sensors in the second subset is coupled to the source terminal of each respective transistor in the second subset.

9 Claims, 10 Drawing Sheets

(56) References Cited

U.S. PATENT DOCUMENTS

| | | |
|---|---|---|
| 9,722,048 B1 | 8/2017 | Balakrishnan et al. |
| 2002/0140016 A1 | 10/2002 | Cha |
| 2003/0223283 A1 | 12/2003 | Kunikiyo |
| 2005/0042825 A1 | 2/2005 | Kitamura et al. |
| 2006/0275962 A1 | 12/2006 | Lee |
| 2007/0145464 A1 | 6/2007 | Voshell et al. |
| 2008/0203469 A1 | 8/2008 | Gruening-von Schwerin |
| 2010/0059837 A1 | 3/2010 | Kim et al. |
| 2010/0091546 A1* | 4/2010 | Liu ............... G11C 17/02 365/97 |
| 2010/0142294 A1 | 6/2010 | Carman |
| 2011/0171803 A1 | 7/2011 | Kakoschke et al. |
| 2011/0269251 A1 | 11/2011 | Kim et al. |
| 2012/0008367 A1 | 1/2012 | Kajiyama |
| 2012/0080725 A1 | 4/2012 | Manos et al. |
| 2012/0155157 A1* | 6/2012 | Oh ............... G11C 11/1675 365/158 |
| 2014/0103471 A1 | 4/2014 | Lupino et al. |
| 2014/0124827 A1 | 5/2014 | Holz et al. |
| 2016/0079307 A1 | 3/2016 | Lu |
| 2016/0181272 A1 | 6/2016 | Rabkin et al. |
| 2016/0188495 A1* | 6/2016 | Naeimi ............ G06F 12/0246 711/103 |
| 2016/0233333 A1 | 8/2016 | Toh et al. |
| 2016/0276574 A1* | 9/2016 | Ohsawa ............ H01L 43/08 |
| 2017/0062035 A1* | 3/2017 | Antonyan .......... G11C 11/1697 |
| 2017/0263297 A1* | 9/2017 | Matsuoka ......... G11C 11/1693 |
| 2017/0278556 A1 | 9/2017 | Antonyan |
| 2019/0103467 A1 | 4/2019 | Takaki et al. |
| 2019/0206716 A1 | 7/2019 | Kim et al. |
| 2019/0206941 A1 | 7/2019 | Kim et al. |
| 2019/0207024 A1 | 7/2019 | Kim et al. |

OTHER PUBLICATIONS

Son et al., "Highly Manufacturable Device Isolation Technology Using Laser-Induced Epitaxial Growth for Monolithic Stack Devices," IEEE Transactions on Electron Devices, vol. 58, No. 11, Nov. 2011, pp. 3863-3868.

Chung, K., "Silicon-Based Epitaxy by Chemical Vapor Deposition Using Novel Precursor Neopentasilane," Dissertation, Princeton University, Jun. 2010, 149 pages.

Kim et al., U.S. Appl. No. 15/857,387, filed Dec. 28, 2017.

Kim et al., U.S. Appl. No. 15/857,410, filed Dec. 28, 2017.

Final Office Action from U.S. Appl. No. 15/857,410, dated May 21, 2019.

International Search Report and Written Opinion from PCT Application No. PCT/US18/67097, dated Mar. 14, 2019.

Non-Final Office Action from U.S. Appl. No. 15/857,410, dated Dec. 12, 2018.

Kim et al., U.S. Appl. No. 16/237,143, filed Dec. 31, 2018.

International Search Report and Written Opinion from PCT Application No. PCT/US18/67100, dated Feb. 26, 2019.

Non-Final Office Action from U.S. Appl. No. 16/237,143, dated Jun. 17, 2019.

Restriction Requirement from U.S. Appl. No. 15/857,387, dated Jun. 27, 2019.

Advisory Action from U.S. Appl. No. 15/857,410, dated Aug. 2, 2019.

Notice of Allowance from U.S. Appl. No. 15/857,387, dated Aug. 23, 2019.

* cited by examiner

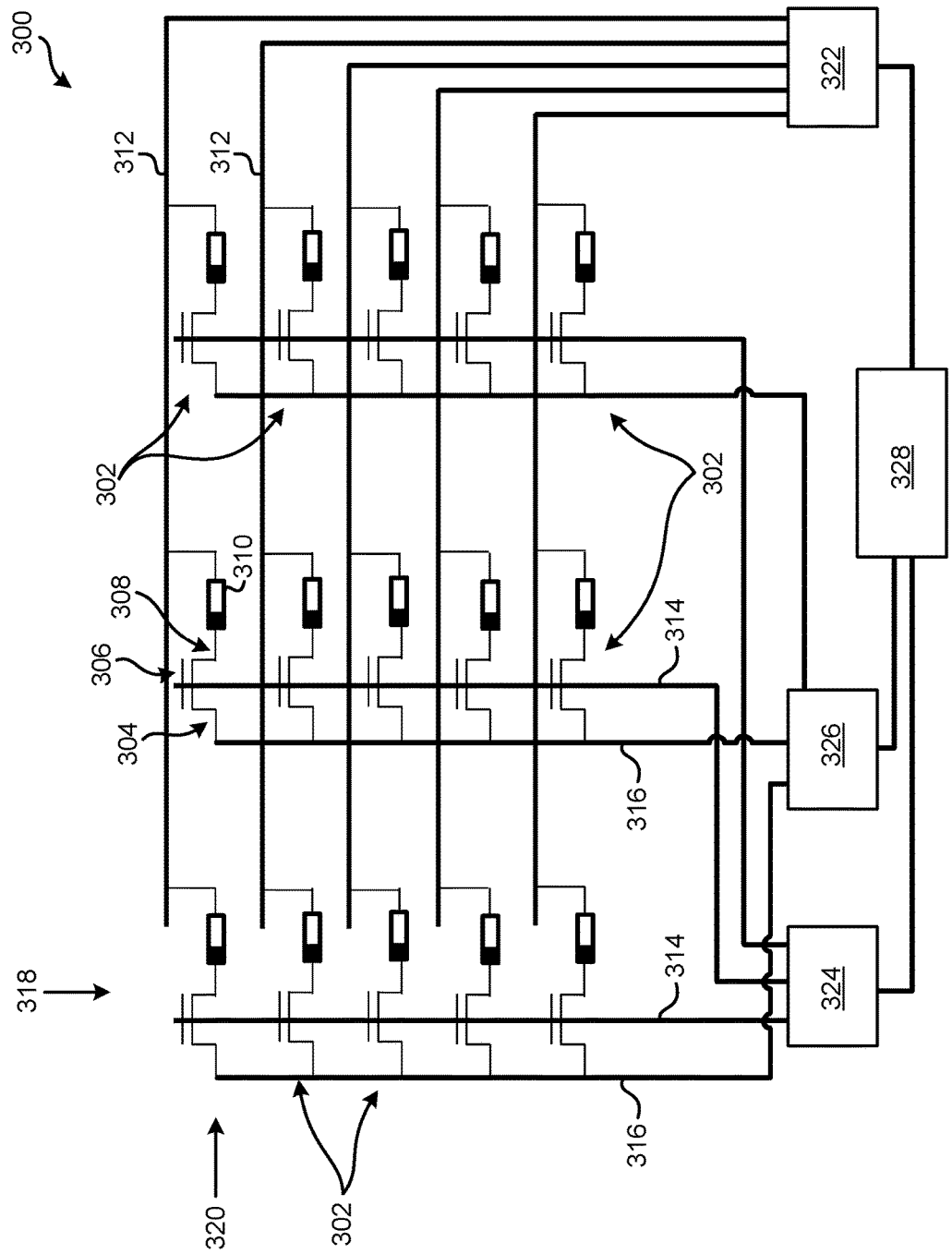

PERPENDICULAR MAGNETIC TUNNEL JUNCTION MEMORY CELLS HAVING SHARED SOURCE CONTACTS

FIELD OF THE INVENTION

The present invention relates to magnetoresistive random-access memory (MRAM), and more particularly, this invention relates to increasing the effective storage density of MRAM.

BACKGROUND

MRAM is a non-volatile memory technology that stores data through magnetic storage elements. Because MRAM is non-volatile, memory written thereto may be retained even when a power supply of the MRAM is turned off. The magnetic storage elements used to actually store the data include two ferromagnetic plates, or electrodes, that can hold a magnetic field and are separated by a non-magnetic material, such as a non-magnetic metal or insulator. In general, one of the plates is referred to as the reference layer and has a magnetization which is pinned. In other words, the reference layer has a higher coercivity than the other plate and requires a larger magnetic field or spin-polarized current to change the orientation of its magnetization. The second plate is typically referred to as the free layer and has a magnetization direction which can be changed by relatively smaller magnetic fields or a spin-polarized current relative to the reference layer.

MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

An important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density.

SUMMARY

A magnetic device, according to one approach, includes: a plurality of perpendicular magnetic tunnel junction (p-MTJ) cells, each p-MTJ cell having a transistor and a magnetic tunnel junction (MTJ) sensor. Moreover, each of the transistors includes a drain terminal, a source terminal, and a gate terminal. The magnetic device also includes: a first common word line coupled to the gate terminal of each transistor in a first subset of the plurality of p-MTJ cells, a first common bit line coupled to a first end of each MTJ sensor in a second subset of the plurality of p-MTJ cells, and a first common source line coupled to the drain terminal of each transistor in the first subset. A second end of each of the MTJ sensors in the second subset is coupled to the source terminal of each respective transistor in the second subset.

A processor-implemented method for writing to MRAM, the processor-implemented method, according to another embodiment, includes: writing a logical 1 to each MTJ sensor in a first row, and writing a logical 0 to a subset of the MTJ sensors in the first row. Writing a logical 1 to each MTJ sensor in a first row includes simultaneously performing the following operations: applying a low voltage to a first common bit line which is coupled to each of the MTJ sensors in the first row; applying a high voltage to each common word line coupled to a gate terminal of each of the respective transistors in the first row; and applying a high voltage to each common source line coupled to a drain terminal of each of the respective transistors in the first row. Moreover, each of the MTJ sensors in the first row is coupled to a source terminal of a respective transistor. Furthermore, writing a logical 0 to a subset of the MTJ sensors in the first row includes simultaneously performing the following operations: applying a high voltage to the first common bit line; applying a high voltage to each common word line coupled to a gate terminal of each of the respective transistors in the subset; applying a low voltage to each common word line coupled to a gate terminal of each of the respective transistors not in the subset; and applying a low voltage to each of the common source lines.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 3 is a schematic view of a MRAM array according to one embodiment.

DETAILED DESCRIPTION

Figure 1:
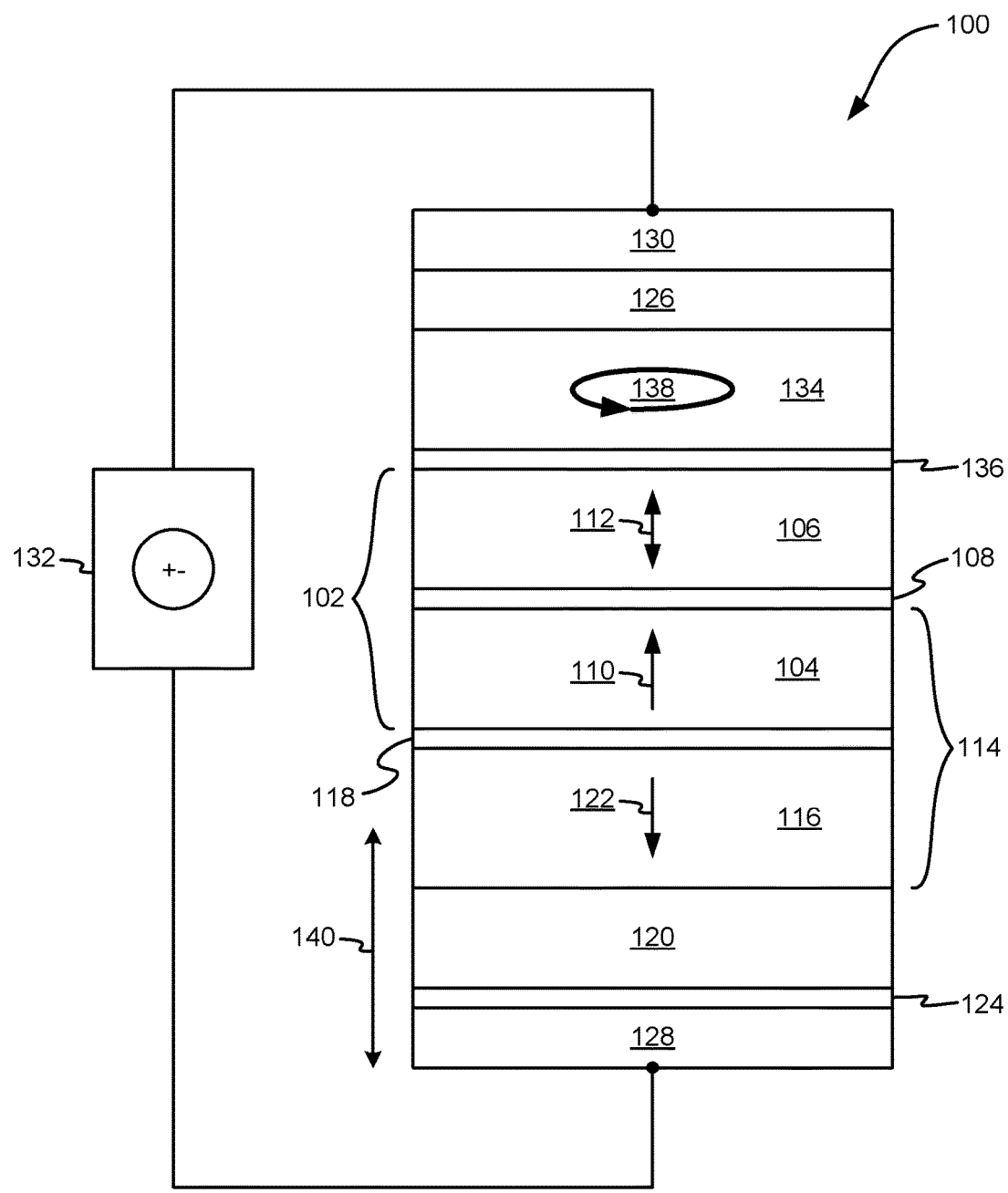
FIG. 1 is a representational view of a sensor stack according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of MRAM having improved data storage density and/or related systems and methods.

In one general embodiment, a magnetic device includes: a plurality of perpendicular magnetic tunnel junction (p-MTJ) cells, each p-MTJ cell having a transistor and a magnetic tunnel junction (MTJ) sensor. Moreover, each of the transistors includes a drain terminal, a source terminal, and a gate terminal. The magnetic device also includes: a first common word line coupled to the gate terminal of each transistor in a first subset of the plurality of p-MTJ cells, a first common bit line coupled to a first end of each MTJ sensor in a second subset of the plurality of p-MTJ cells, and a first common source line coupled to the drain terminal of each transistor in the first subset. A second end of each of the MTJ sensors in the second subset is coupled to the source terminal of each respective transistor in the second subset.

In another general embodiment, a processor-implemented method for writing to MRAM, the processor-implemented method including: writing a logical 1 to each MTJ sensor in a first row, and writing a logical 0 to a subset of the MTJ sensors in the first row. Writing a logical 1 to each MTJ sensor in a first row includes simultaneously performing the following operations: applying a low voltage to a first common bit line which is coupled to each of the MTJ sensors in the first row; applying a high voltage to each common word line coupled to a gate terminal of each of the respective transistors in the first row; and applying a high voltage to each common source line coupled to a drain terminal of each of the respective transistors in the first row. Moreover, each of the MTJ sensors in the first row is coupled to a source terminal of a respective transistor. Furthermore, writing a logical 0 to a subset of the MTJ sensors in the first row includes simultaneously performing the following operations: applying a high voltage to the first common bit line; applying a high voltage to each common word line coupled to a gate terminal of each of the respective transistors in the subset; applying a low voltage to each common word line coupled to a gate terminal of each of the respective transistors not in the subset; and applying a low voltage to each of the common source lines.

As previously mentioned, MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

Spin transfer torque or spin transfer switching, uses spin-aligned (polarized) electrons to change the magnetization orientation of the free layer in the MTJ. In general, electrons possess a spin, which is a quantized amount of angular momentum intrinsic to the electron. An electrical current is generally not polarized, in that it generally includes of 50% spin up and 50% spin down electrons. However, passing a current though a magnetic layer polarizes electrons in the current with the spin orientation corresponding to the magnetization direction of the magnetic layer. Thus, the magnetic layer acts as a polarizer and produces a spin-polarized current as a result. Moreover, if a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, thereby effectively writing either a logical "1" or a logical "0" based on whether the free layer is in the parallel or anti-parallel states relative to the reference layer.

Referring to FIG. 1, an illustrative sensor stack for a MTJ memory element 100 is shown according to one embodiment. The MTJ memory element 100 may be used in a p-MTJ memory element, as described in various embodiments herein. The MTJ memory element 100 may include a MTJ 102 that may include a magnetic reference layer 104, a magnetic free layer 106, and a thin, non-magnetic, electrically-insulating magnetic tunnel barrier layer 108 positioned between the reference layer 104 and the free layer 106 in a layer thickness direction 140. The tunnel barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic keeper layer 116 and a non-magnetic, antiparallel coupling layer 118 positioned between the keeper layer 116 and the reference layer 104 in the thickness direction 140. The antiparallel coupling layer 118 may include any suitable material known in the art, such as Ru, and may be constructed to have a thickness that causes ferromagnetic antiparallel coupling of the keeper layer 116 and the reference layer 104.

In one approach, the keeper layer 116 may be exchange coupled with an antiferromagnetic layer 120, which may include any suitable material known in the art, such as IrMn. Exchange coupling between the antiferromagnetic layer 120 and the keeper layer 116 strongly pins the magnetization 122 of the keeper layer 116 in a first direction. The antiparallel coupling between the keeper layer 116 and the reference layer 104 pins the magnetization 110 of the reference layer 104 in a second direction opposite to the direction of magnetization 122 of the keeper layer 116.

According to one approach, a seed layer 124 may be positioned below the keeper layer 116 in the thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the MTJ memory element 100, respectively, in one approach. The lower electrode 128 and the upper electrode 130 may be constructed of a non-magnetic, electrically conductive material of a type known in the art, such as TaN, TiN, W, etc., and may provide an electrical connection with a circuit 132. The circuit 132 may include a current source, and may further include circuitry for reading an electrical resistance across the MTJ memory element 100.

The magnetic free layer 106 has a magnetic anisotropy that causes the magnetization 112 of the free layer 106 to remain stable in one of two directions perpendicular to the horizontal plane of the free layer 106. In a write mode of use for the MTJ memory element 100, the orientation of the magnetization 112 of the free layer 106 may be switched between these two directions by applying an electrical current through the MTJ memory element 100 via the circuit 132. A current in a first direction causes the magnetization 112 of the free layer 106 of the MTJ memory element 100 to flip to a first orientation, and a current in a second direction opposite to the first direction causes the magnetization 112 of the free layer 106 of the MTJ memory element 100 to flip to a second, opposite direction.

For example, if the magnetization 112 is initially oriented in an upward direction in FIG. 1, applying a current in a downward direction through the MTJ memory element 100 causes electrons to flow in an opposite direction upward through the MTJ memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the MTJ memory element 100 in an upward direction in FIG. 1 causes electrons to flow in an opposite direction, downward through the MTJ memory element 100. However, because the magnetization 112 of the free layer 106 is opposite to the magnetization 110 of the reference layer 104, the electrons will not be able to pass through the tunnel barrier layer 108. As a result, the electrons (which have been spin polarized by the magnetization 112 of the free layer 106) will accumulate at the junction between the free layer 106 and the tunnel barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the MTJ memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a processional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the MTJ memory element 100.

The MTJ memory element 100 described in FIG. 1 is intended to provide context to the various embodiments described herein. The structures and methods described herein in accordance with various embodiments may include a portion of the MTJ memory element 100 described in FIG. 1 and/or used in conjunction with the MTJ memory element 100, in various approaches.

It should be noted that the MTJ sensor stack configuration illustrated in FIG. 1 is in no way intended to limit the invention. Rather, the sensor stack included in MTJ memory element 100 of FIG. 1 is presented by way of example only. Accordingly, any of the embodiments described herein which include reference to a MTJ structure (e.g., sensor stack) may implement a MTJ sensor structure similar to or the same as that shown in FIG. 1, or any other MTJ sensor structure which would be apparent to one skilled in the art after reading the present description.

A MTJ sensor stack, e.g., such as that illustrated in FIG. 1, may be electrically coupled with a transistor in order to write information to the MTJ sensor stack such that the information is stored in the sensor stack itself. As previously mentioned, information may be written (or overwritten) to a MTJ sensor stack by causing the magnetic orientation of the free layer to flip. Moreover, flipping the magnetic orientation of the free layer may be achieved by selectively passing a current through the sensor stack, e.g., as will be described in further detail below.

Figure 2:
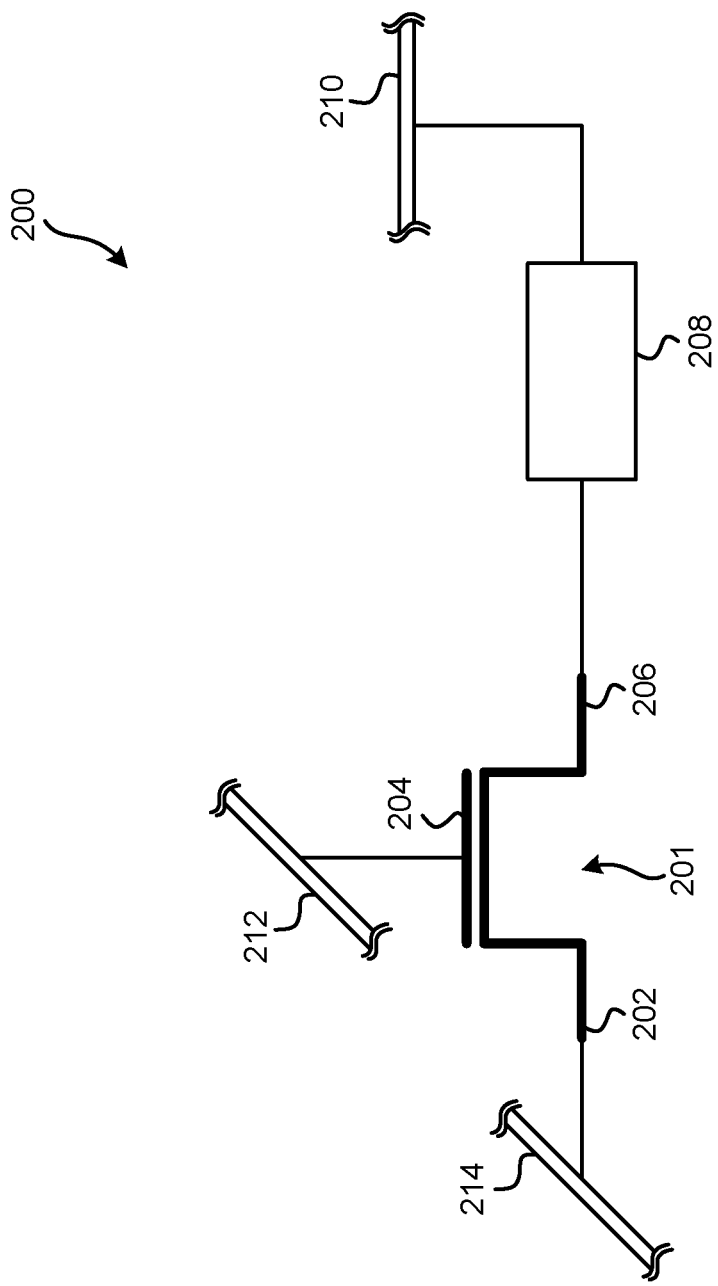
FIG. 2 is a schematic view of a perpendicular magnetic tunnel junction cell according to one embodiment.

Looking now to FIG. 2, a basic schematic view of a p-MTJ cell 200 of memory is illustrated in accordance with one embodiment. As an option, the present p-MTJ cell 200 may be implemented in conjunction with features from any other embodiment listed herein, such as those described with reference to the other FIGS., e.g., such as FIG. 1. Of course, however, such p-MTJ cell 200 and others presented herein may be used in various applications and/or in permutations which may or may not be specifically described in the illustrative embodiments listed herein. Further, the p-MTJ cell 200 presented herein may be used in any desired environment.

As shown, the p-MTJ cell 200 includes a transistor 201 which has a drain terminal 202, a gate terminal 204, and a source terminal 206. Moreover, a MTJ sensor stack 208 is electrically coupled to both the source terminal 206 of the transistor structure 201 as well as a bit line 210. The gate terminal 204 is also shown as being electrically coupled to a word line 212, while the drain terminal 202 is electrically coupled to a source line 214. Each of the bit line 210, the word line 212 and the source line 214 are preferably able to supply a voltage to a respective terminal of the transistor structure 201 in order to induce or inhibit a current from flowing through the transistor structure 201. Moreover, although the drain terminal 202 and source terminal 206 are labeled as show in FIG. 2, it should be noted that the source and drain terminals may be interchangeable in approaches where both terminals include (are) n+ doped regions, e.g., from a material composition point of view. However, a voltage is applied to one of the terminals 202, 206 which is a higher voltage than a voltage applied to the other of the terminals 202, 206, the terminal having a higher voltage bias applied thereto will effectively be the drain terminal and the other of the two terminals having the lower voltage bias applied thereto will effectively be the source terminal, e.g., as would be appreciated by one skilled in the art after reading the present description.

It follows that the combination of signals (voltages) applied to each of the terminals 202, 204, 206 of the transistor structure 201 may be selectively adjusted in order to ultimately control whether a current is applied to the MTJ sensor stack 208 coupled to the source terminal 206, and in which direction. Thus, the signals passed through each of the terminals 202, 204, 206 may ultimately control the spin of electrons in a free layer of the sensor stack 208, thereby writing either a logical "1" or logical "0" thereto, e.g., as described above. Accordingly, the resulting p-MTJ cell structure 200 presented in FIG. 2 may effectively represent a single p-MTJ cell which may be used in MRAM.

It should also be noted that the specific layers which are included in the sensor stack 208 may vary depending on the desired approach. For instance, in some approaches the sensor stack 208 may include the same or a similar structure as the MTJ memory element 100 illustrated in FIG. 1. However, in other approaches the sensor stack 208 may include any configuration of layers which would be apparent to one skilled in the art after reading the present description.

As described above, an important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density.

In sharp contrast to these restrictions experienced by conventional MRAM storage, various embodiments included herein are able to achieve data storage densities which are much higher than previously possible. By implementing a common (e.g., shared) source line extending between various transistors according to some of the different approaches described below, the resulting memory arrays may provide the desirable performance of MRAM in a compact configuration, e.g., as will be described in further detail below.

Referring now to FIG. 3, a schematic view of a MRAM array 300 is illustrated in accordance with one embodiment. As an option, the present MRAM array 300 may be implemented in conjunction with features from any other embodiment listed herein, such as those described with reference to the other FIGS., e.g., such as FIGS. 1-2. Of course, however, such MRAM array 300 and others presented herein may be used in various applications and/or in permutations which may or may not be specifically described in the illustrative embodiments listed herein. Further, the MRAM array 300 presented herein may be used in any desired environment.

As shown, the MRAM array 300 (e.g., magnetic device) includes a plurality of transistors 302 which are oriented in a grid-type fashion. Each of the transistors 302 includes a drain terminal 304, a gate terminal 306 and a source terminal 308, respectively. Moreover, each of the transistors is coupled to a MTJ sensor stack 310. According to preferred approaches, each coupled MTJ sensor 310 and transistor 302 pair are a p-MTJ cell. These p-MTJ cells differ from conventional types of memory cells in that terminals of the transistors included in the p-MTJ cells are formed in a vertical fashion along the deposition direction of the transistor structure, rather than perpendicular to the deposition direction. Thus, the transistors in the p-MTJ cells have a significantly smaller footprint compared to conventional transistors, or even conventional transistors. According to some illustrative approaches, the effective cell size of each of the p-MTJ cells may be about 2 F×2.5 F, or equivalently about 5 $F^2$, where "F" represents the minimum feature size defined by the lithography limits associated with the technology used to fabricate each of the p-MTJ cells. Thus, depending on the actual process(es) used to form the various p-MTJ cells, their effective size may vary depending on the value of F. This effective cell size of each of the p-MTJ cells is significantly smaller than conventionally achievable.

Figure 6A:
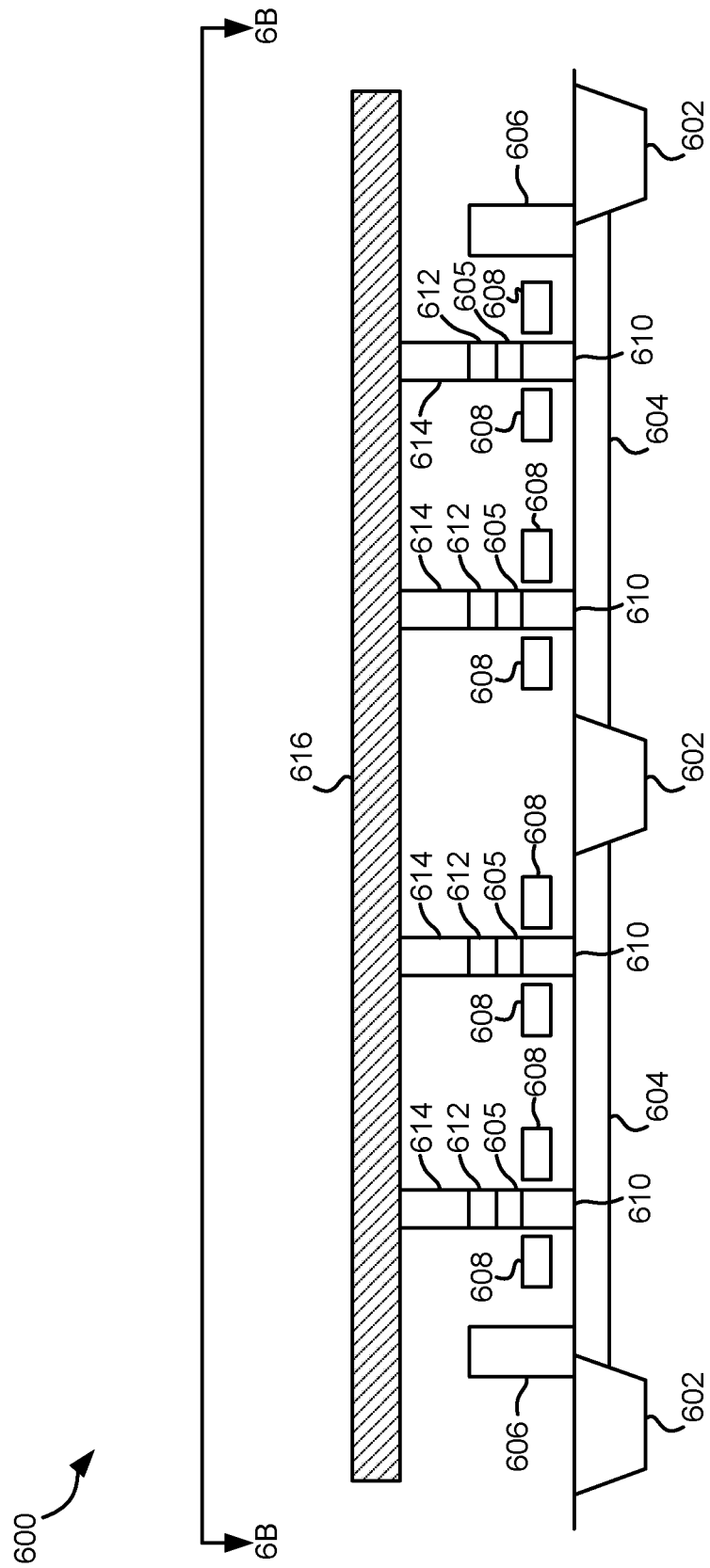
FIG. 6A is a partial representational view of an array of a MRAM array according to one embodiment.
Figure 6B:
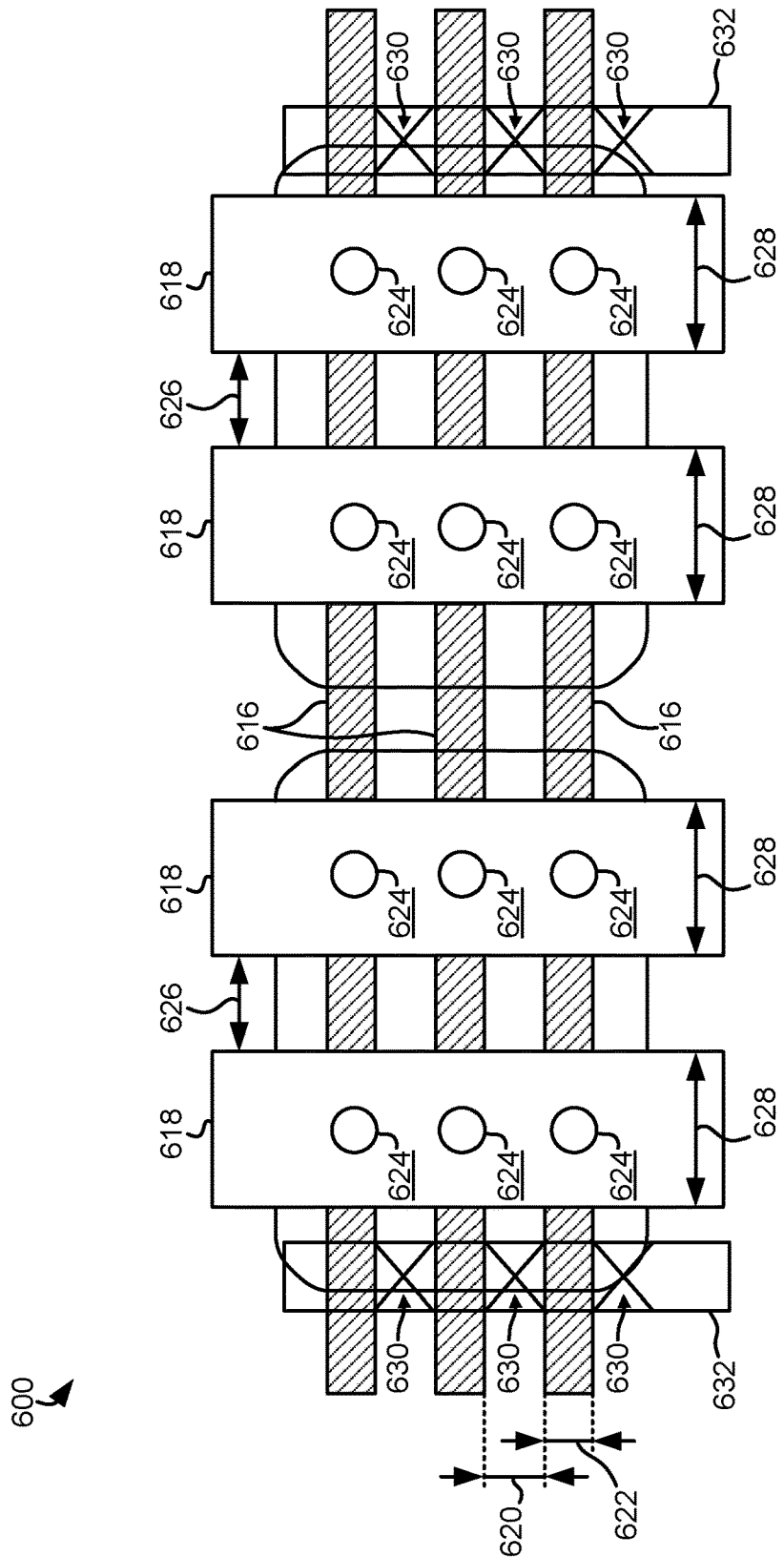
FIG. 6B is a top-down view of the MRAM array in FIG. 6A taken along reference line 6B-6B.
Figure 6C:
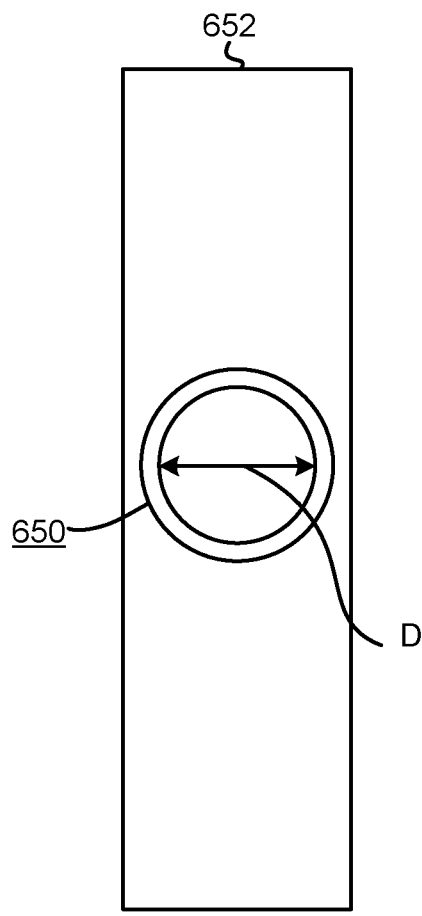
FIG. 6C is a partial top-down view of a perpendicular magnetic tunnel junction cell according to one embodiment.

Having a smaller footprint also allows for a larger number of transistors to be positioned in a given area, thereby increasing storage density, reducing an overall footprint of the memory module, etc. Referring momentarily to FIGS. 6A-6C below, a compositional view of transistors implemented in p-MTJ cells is illustrated according to an exemplary embodiment. It follows that any one or more of the transistors 302 in the MRAM array 300 in FIG. 3 may include any of the layers, overall structure, orientation, etc. illustrated in FIGS. 6A-6C.

The MTJ sensor stack 310 is electrically coupled between the source terminal 308 of each of the transistors 302 as well as a respective bit line 312. Moreover, each of the gate terminals 306 are electrically coupled to a respective word line 314, while each of the drain terminals 304 are electrically coupled to a respective source line 316. Each of the bit line 312, the word line 314 and the source line 316 are preferably able to supply voltages to a respective terminal of the various transistors 302 in the MRAM array 300 in order to induce or inhibit a current from flowing through select ones of the transistors 302. Accordingly, the voltages applies to the bit lines 312, the word lines 314 and/or the source lines 316 may control whether a logical "1" or a logical "0" is written to select ones of the MRAM sensor stacks 310 coupled to the various transistors 302. It follows that the combined structure of the transistors 302 and the MRAM sensor stacks 310 may effectively form a "memory cell" as described above. Moreover, the memory cell is able to store one bit of information, i.e., a logical "1" or a logical "0". Thus, the storage capacity of the MRAM array 300 may effectively be defined by the number of transistor 302 and MTJ sensor stack 310 pairings (or p-MTJ cells) included therein.

Although applying specific currents to the terminals of an individual transistor structure may be relatively straightforward for instances where each terminal of the individual transistor structure is coupled to a different (unique) voltage supply line, applying voltages to the different terminals of the different transistors 302 shown in FIG. 3 is significantly more complex. Specifically, each of the bit lines 312, the word lines 314 and the source lines 316 are electrically coupled to more than one of the transistors 302, thereby making selective writing to certain ones of the MTJ sensor stacks 310 more difficult than in conventional products. Thus, writing to certain ones of the MTJ sensor stacks 310 may involve applying unique combinations of voltages, e.g., as will be described in further detail below. For instance, see method 400 in FIGS. 4A-4C below.

With continued reference to FIG. 3, the various different transistors 302 are arranged in a grid-like fashion. In other words, the different transistors 302 are oriented in rows and columns which are substantially perpendicular to each other. This grid-like organization of the different transistors 302 provides an efficient use of space and allows for the memory density of the resulting MRAM array 300 to be maximized.

However, it should be noted that this grid-like arrangement of the transistors 302 shown in FIG. 3 is in no way intended to limit the invention. Rather, the transistors 302 and/or any of the lines 312, 314, 316 may be arranged differently depending on the desired approach.

As mentioned above, the grid-like arrangement of the transistors 302 forms distinct columns 318 and rows 320 which extend throughout the MRAM array 300. Moreover, the columns 318 and rows 320 are interleaved such that each of the transistors 302 are part of a defined row as well as a defined column. Thus, a specific one of the transistors may be individually identified given the row and column which it is located in. Although only three columns 318 and five rows 320 are illustrated in the present embodiment, any desired number of rows and/or columns may be implemented in order to scale the size of (e.g., the number of memory cells in) the MRAM array 300, and thus the storage capacity of the MRAM array 300. According to an example, hundreds, thousands, millions, etc. of p-MTJ cells (transistor 302 and MTJ sensor stack 310 pairings) may be organized in various rows and columns which extend perpendicularly relative to each other.

Each of the bit lines 312, the word lines 314 and the source lines 316 are illustrated as being coupled to (e.g., in electrical communication with) a multiplexer 322, 324, 326 respectively. Moreover, each of the multiplexers 322, 324, 326 are coupled to a central controller 328. However, it should be noted that any one or more of these lines 312, 314, 316 may extend to any desired electrical component. Each of the multiplexers 322, 324, 326 may serve as an electrical circuit which is used to control a voltage that is applied to each of the respective lines 312, 314, 316, e.g., using logic gates for instance. Similarly, the controller 328 may be configured to perform various processes which effect the voltages applied by the multiplexers 322, 324, 326 to each of the respective lines 312, 314, 316, and in turn, the different terminals of the various transistors 302.

By acting as a voltage generator, the multiplexers 322, 324, 326 may be configured to counteract signal dampening experienced in the respective lines 312, 314, 316 coupled thereto. In other approaches, one or more of the multiplexers 322, 324, 326 may serve as a sense amplifier in addition to a voltage generator. As a result, each of the multiplexers 322, 324, 326 may be able to perform a read operation by receiving a signal from various ones of the transistors 302, as well as perform write operations by applying a desired voltage to the respective lines 312, 314, 316 coupled thereto. Although each of the common source lines 316 are shown as being coupled to the same multiplexer 326 in FIG. 3, it may be preferred that a sense amplifier enabled multiplexer circuit be coupled to each of the respective common source lines 316. Accordingly, in some approaches each of the common source lines 316 may be coupled to a different sense amplifier enabled multiplexer.

As mentioned above, each of the bit lines 312, the word lines 314 and the source lines 316 are electrically coupled to more than one of the transistors 302, thereby making selective writing to certain ones of the MTJ sensor stacks 310 more difficult than in conventional products. Of particular note is that transistors 302 positioned in a same column 318 share a common source line 316. Moreover, each of the transistors 302 is again preferably part of a p-MTJ cell. This configuration of p-MTJ cells having the drain terminals 304 of the transistors 302 coupled to a common source line 316 further reduce the footprint of each respective cell of the MRAM array 300. In many conventional products, the source terminal of each of the transistors is coupled to a different unique source line. While this conventional scheme allows for each of the transistors to be individually addressed, it also has an impact on the achievable storage density of the resulting memory.

In sharp contrast, by implementing source lines 316 which are common to transistors in multiple p-MTJ cells, various ones of the approaches included herein are able to reduce the achievable storage density even further, thereby achieving even greater increases to the achievable storage density, reductions in an overall footprint of the memory module, etc. than conventionally possible. Although implementing transistors having a common source line may seem like a straightforward way of increasing the storage density from a structural standpoint to one skilled in the art after reading the present description, this does not consider the functional effects such a structural (e.g., physical) change has on the performance of the overall MRAM array 300. For instance, because each terminal of each transistor 302 is coupled to a voltage supply line that is shared with multiple other transistors 302, it is unclear how writing data to specific MTJ sensor stacks 310 may be achieved with any accuracy, much less efficiency.

Figure 4A:
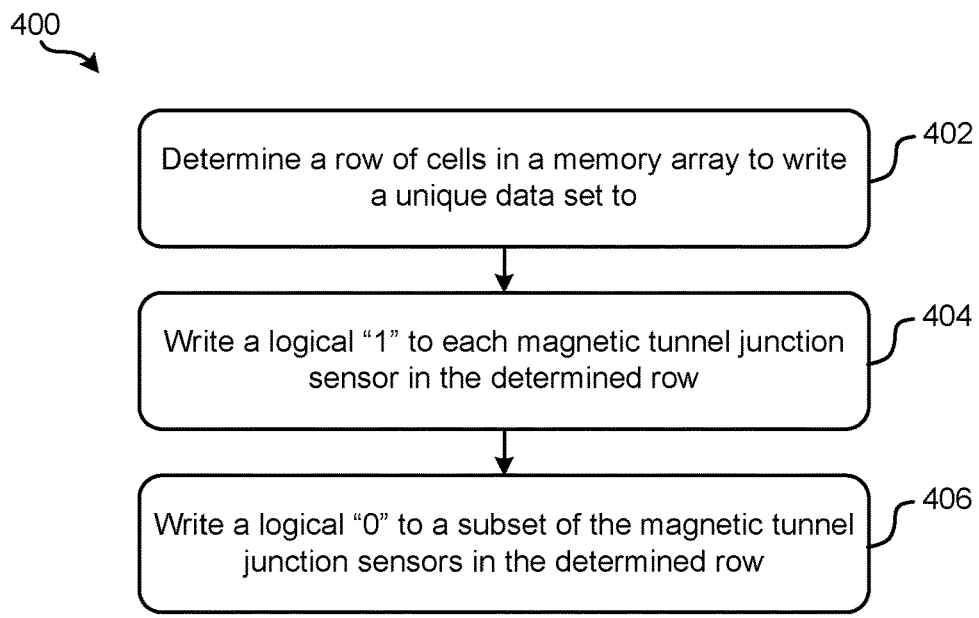
FIG. 4A is a flowchart of a method according to one embodiment.

However, by writing to the cells of the MRAM array 300 in a specific fashion desirably overcomes the issue of having voltage supply lines shared (common) among multiple different memory cells. Referring now to FIG. 4A, a flowchart of a high-level method 400 for writing a unique data set to a sensor stacks in a row of MRAM cells is illustrated in accordance with one embodiment. The method 400 may be performed in accordance with the present invention in any of the environments depicted in FIGS. 1-3, among others, in various embodiments. Of course, more or less operations than those specifically described in FIG. 4A may be included in method 400, as would be understood by one of skill in the art upon reading the present descriptions.

Each of the steps of the method 400 may be performed by any suitable component of the operating environment. For example, in various embodiments, the method 400 may be partially or entirely performed by a controller (e.g., see controller 328 in FIG. 3), or some other device having one or more processors therein. The processor, e.g., processing circuit(s), chip(s), and/or module(s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art.

As shown, method 400 may initiate with operation 402 which includes determining a row of cells in a MRAM array to write a unique data set to. As described above, the cells in a MRAM array may be oriented in a grid-like fashion, the cells thereby forming various rows and columns. Moreover, cells oriented in a same row may share a common bit line, while cells oriented in a same column may share a common source line as well as a common word line. Thus, in order to write a logical "1" value to a select cell in such a configuration, a logical "1" is written to every cell in the same row as the select cell. In other words, the common lines coupled to the various cells cause the resulting MRAM array to not have selectability when writing a logical "1" value to a given row of cells. However, despite a lack of selectability when writing a logical "1" value to a given row of cells, the MRAM array is able to write logical "0" values to select ones of the cells in a given row.

Accordingly, by first writing a logical "1" value to all cells in a given row of a MRAM array, followed by selectively writing a logical "0" value to certain ones of the cells in the given row, a unique set of data may be stored in the cells of a given row in a MRAM array. Thus, referring still to FIG. 4A, operation 404 includes writing a logical "1" to each MTJ sensor in the row determined in operation 402, while 406 further includes writing a logical "0" to a subset of the MTJ sensors in the determined row.

Figure 4B:
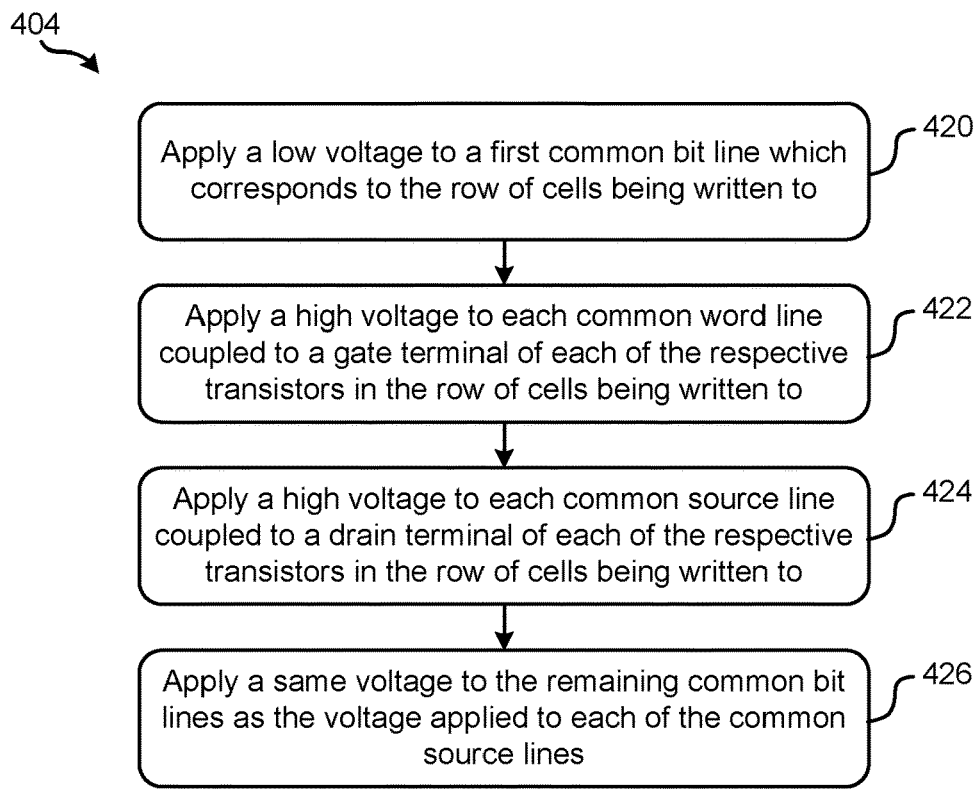
FIG. 4B is a flowchart of sub-operations included in an operation of the method of FIG. 4A according to one embodiment.

Looking now to FIG. 4B, exemplary sub-operations of writing a logical "1" to each MTJ sensor in a row of a MRAM array are illustrated in accordance with one embodiment, one or more of which may be used to perform operation 404 of FIG. 4A. However, it should be noted that the sub-operations of FIG. 4B are illustrated in accordance with one embodiment which is in no way intended to limit the invention.

It should be noted that each of the sub-operations included in FIG. 4B are preferably performed simultaneously (e.g., in parallel) because writing a logical "1" to the sensor stack in even one cell of MRAM involves applying a given voltage to all three terminals of the transistor in the cell, e.g., as would be appreciated by on skilled in the art after reading the present description. Thus, although the various sub-operation in FIG. 4B are shown in a flowchart, each of the sub-operations are preferably performed at the same time. Alternatively, the voltages applied in each of the sub-operations may remain on (e.g., applied to the respective line/terminal of the transistor) until all sub-operations in FIG. 4B are performed, thereby achieving effectively the same result.

As shown, FIG. 4B includes applying a low voltage to a first common bit line which corresponds to the row of cells being written to. See sub-operation 420. The first common bit line may be coupled to each of the MTJ sensors in the row. Moreover, each of the MTJ sensors in the row may be coupled to a source terminal of a respective transistor. As described above, each coupled MTJ sensor and transistor pair are preferably a p-MTJ cell.

Sub-operation 422 also includes applying a high voltage to each common word line coupled to a gate terminal of each of the respective transistors in the row being written to. Furthermore, sub-operation 424 includes applying a high voltage to each common source line coupled to a drain terminal of each of the respective transistors in the row being written to.

By simultaneously applying the voltages described in sub-operations 420, 422, 424, logical "1" may be written to a unique data set of the sensors, specifically sensors which are oriented in a same row of memory cells. However, as shown above, each of the MRAM cells in a row may also be a part of a column of additional MRAM cells. Thus, the process of writing a unique data set to sensor stacks in a row of MRAM cells may also intrinsically include processes which are implemented to ensure that data is not written to other MRAM cells in a same column as those in the row being written to.

Accordingly, FIG. 4B further includes applying a same voltage to the remaining common bit lines as the voltage applied to each of the common source lines. See sub-operation 426. By applying a voltage to the remaining common bit lines which matches the voltage applied to the common source lines, the transistors in these other rows are not activated and therefore no current is passed therethrough. As a result, data is not written to the MTJ sensors in the remaining rows. Thus, data may be written to select rows of memory without effecting (e.g., overwriting) data which may be stored in the MTJ sensors of the remaining rows.

Figure 5A:
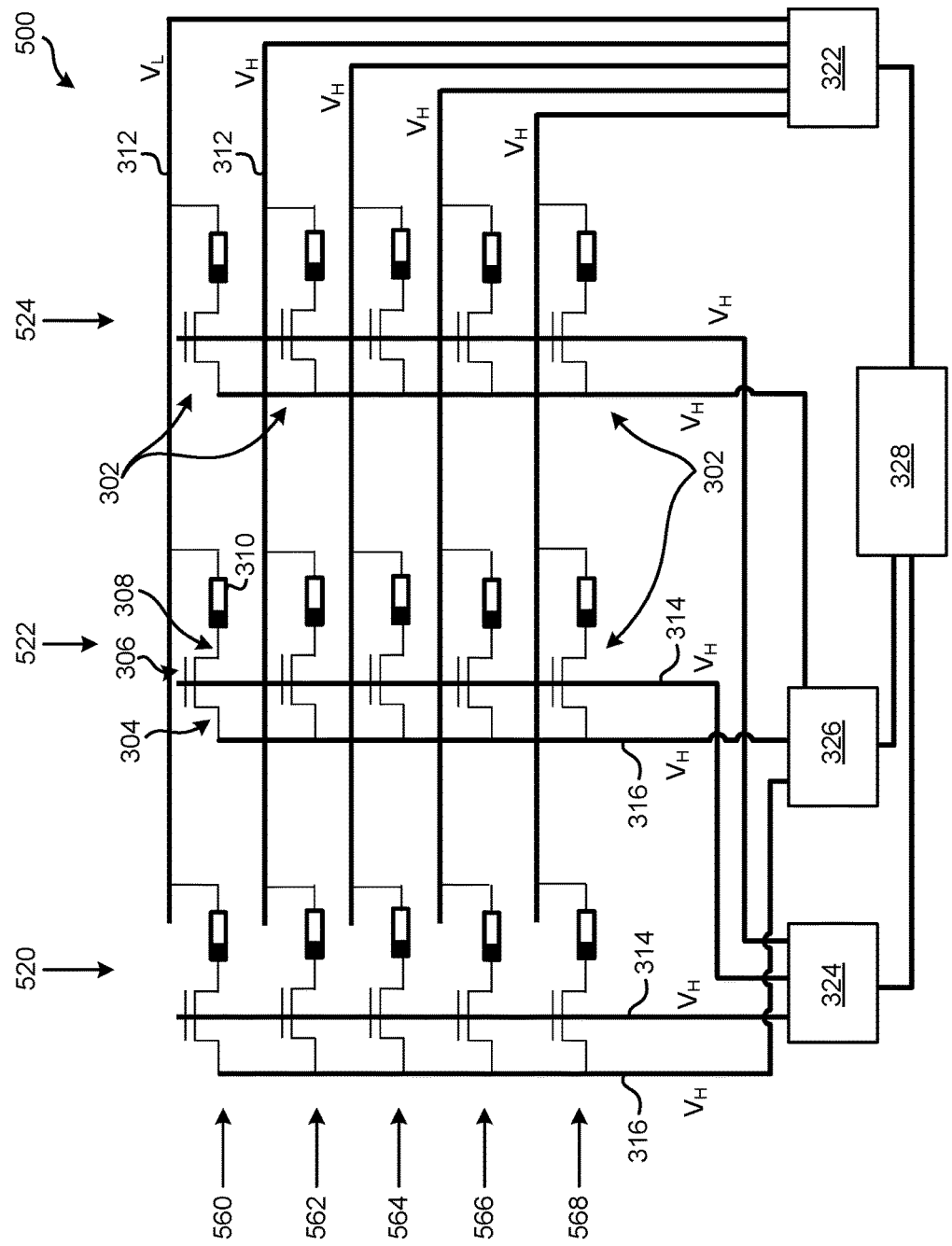
FIGS. 5A-5B are a schematic view of a MRAM array according to one embodiment.

Referring momentarily to FIG. 5A, an exemplary MRAM array 500 having voltage supply lines with the different voltages specified in the sub-operations of FIG. 4B applied thereto is illustrated in accordance with one embodiment. It should be noted that some of the components included in the exemplary MRAM array 500 of FIG. 5A have common numbering with some of the components included in FIG. 3 above, and therefore may include any of the approaches described above with reference to the MRAM array 300.

As shown, the common bit line 312 corresponding to the first row 560 has a low bias voltage $V_L$ applied thereto. Moreover, a high bias voltage $V_H$ is applied to each of the common source lines 316 corresponding to cells in each of the columns 520, 522, 524. A high voltage $V_H$ is also applied to each of the common word lines 314 corresponding to cells in each of the columns 520, 522, 524. This unique combination of voltages causes a logical "1" to be written to each of the MTJ sensors 310 in the first row 560.

However, a high voltage $V_H$ is applied to the bit lines 312 in the remainder of the rows 562, 564, 566, 568. Thus, the voltage applied to the bit lines 312 in rows 562, 564, 566, 568 matches the voltage applied to the common source lines 316. As described above, this causes the voltage differential across all the transistors in rows 562, 564, 566, 568 to effectively be zero, thereby causing the transistors to not be activated, and therefore data is not written to the corresponding MTJ sensors 310.

As described above, after a logical "1" has been written to all cells in a desired row of a MRAM array, logical "0" may be written to selective cells in that array. Looking now to FIG. 4C, exemplary sub-operations of writing a logical "0" to select ones of the MTJ sensor in the row of the MRAM array are illustrated in accordance with one embodiment, one or more of which may be used to perform operation 406 of FIG. 4A. However, it should be noted that the sub-operations of FIG. 4C are illustrated in accordance with one embodiment which is in no way intended to limit the invention.

Figure 4C:
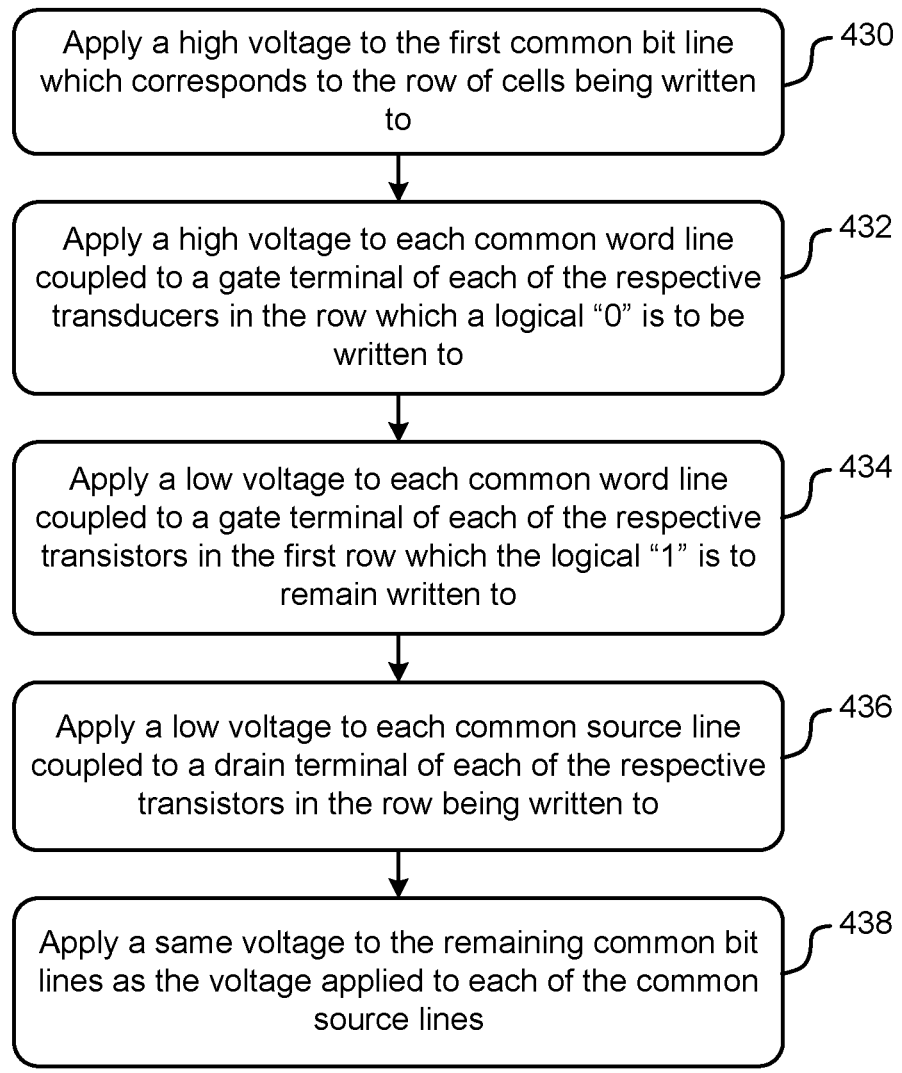
FIG. 4C is a flowchart of sub-operations included in an operation of the method of FIG. 4A according to one embodiment.

It should again be noted that each of the sub-operations included in FIG. 4C are preferably performed simultaneously (e.g., in parallel) because writing a logical "0" to the sensor stack in even one cell of MRAM involves applying a given voltage to all three terminals of the transistor in the cell, e.g., as would be appreciated by on skilled in the art after reading the present description. Thus, although the various sub-operation in FIG. 4C are shown in a flowchart, each of the sub-operations are preferably performed at the same time. Alternatively, the voltages applied in each of the sub-operations may remain on (e.g., applied to the respective line/terminal of the transistor) until all sub-operations in FIG. 4C are performed, thereby achieving effectively the same result.

As shown, FIG. 4C includes applying a high voltage to the first common bit line which corresponds to the row of cells being written to. See sub-operation 430. Again, the first common bit line may be coupled to each of the MTJ sensors in the row. Moreover, each of the MTJ sensors in the row may be coupled to a source terminal of a respective transistor. As described above, each coupled MTJ sensor and transistor pair are preferably a p-MTJ cell.

Sub-operation 432 also includes applying a high voltage to each common word line coupled to a gate terminal of each of the respective transistors in the row which a logical "0" is to be written to. Thus, by selectively applying a high voltage to certain ones of the common word lines, a logical "0" may be used to overwrite the logical "1" previously written to the corresponding MTJ sensor in the first row (see sub-operation 422 of FIG. 4B above). Furthermore, sub-operation 434 includes applying a low voltage to each common word line coupled to a gate terminal of each of the respective transistors in the first row which the logical "1" is to remain written to. Thus, by selectively applying a low voltage to certain ones of the common word lines, the logical "1" previously written to the MTJ sensors may be retained and is not overwritten. Further still, sub-operation 436 includes applying a low voltage to each common source line coupled to a drain terminal of each of the respective transistors in the first row.

By simultaneously applying the voltages described in sub-operations 430, 432, 434, 436, a unique data set may be written to the sensor stacks oriented in a same row of memory cells by selectively overwriting certain logical "1" values with logical "0" values. However, as shown above, each of the MRAM cells in a row may also be a part of a column of additional MRAM cells. Thus, the process of writing a unique data set to sensor stacks in a row of MRAM cells may also intrinsically include processes which are implemented to ensure that data is not written to other MRAM cells in a same column as those in the row being written to.

Accordingly, FIG. 4C further includes applying a same voltage to the remaining common bit lines as the voltage applied to each of the common source lines. See sub-operation 438. Again, by applying a voltage to the remaining common bit lines which matches the voltage applied to the common source lines, the transistors in these other rows are not activated and therefore no current is passed therethrough. As a result, data is not written to the MTJ sensors in the remaining rows. Thus, target data is written to select rows of memory without effecting (e.g., overwriting) data which may be stored in the MTJ sensors of the remaining rows.

Figure 5B:
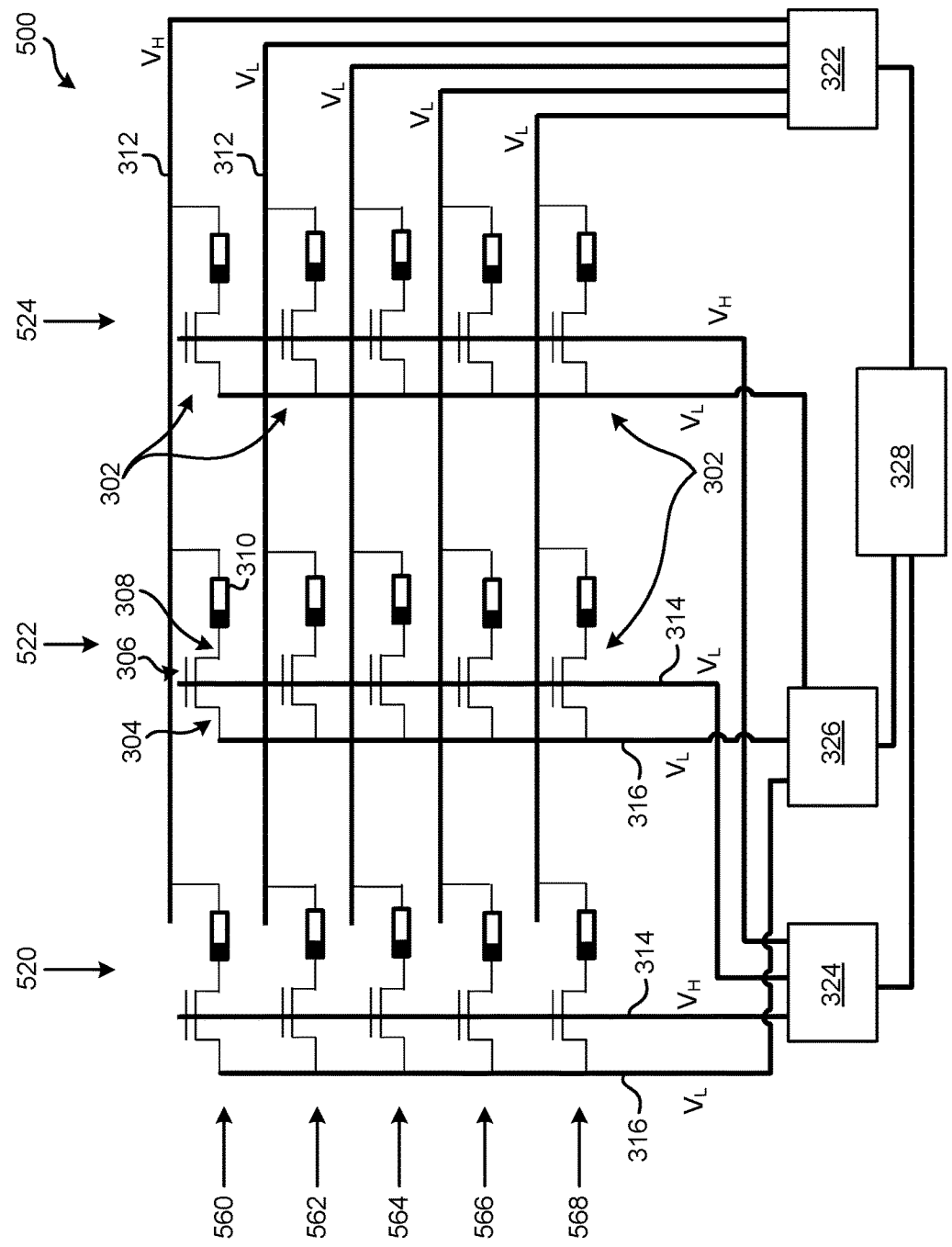

Referring momentarily to FIG. 5B, the exemplary MRAM array 500 from FIG. 5A has a series of different voltages applied to the various voltage supply lines included therein. Specifically, the voltages applied to the voltage supply lines in FIG. 5B correspond to the sub-operations of FIG. 4C.

As shown, the common bit line 312 corresponding to the first row 560 has a high bias voltage $V_H$ applied thereto. Moreover, a low bias voltage $V_L$ is applied to each of the common source lines 316 corresponding to cells in each of the columns 520, 522, 524. As for the common word lines 314, a high voltage $V_H$ is applied to the common word lines which correspond to the outside columns, thereby causing a logical "0" to be written to the MTJ sensor 310 in the cell located in the first column 520, first row 560, as well as the MTJ sensor 310 in the cell located in the third column 524, first row 560.

However, a low voltage $V_L$ is applied to the bit lines 312 in the remainder of the rows 562, 564, 566, 568. Thus, the voltage applied to the bit lines 312 in rows 562, 564, 566, 568 matches the voltage applied to the common source lines 316. As described above, this causes the voltage differential across all the transistors in rows 562, 564, 566, 568 to effectively be zero, thereby causing the transistors to not be activated, and therefore data is not written to the corresponding MTJ sensors 310.

Although relative voltages are described in the sub-operations of FIGS. 4A-4B as being applied to certain terminals of the transistors, it should again be noted that the source and drain terminals may be interchangeable in approaches where both terminals include (are) n+ doped regions, e.g., from a material composition point of view. However, a voltage is applied to one of the terminals which is a higher voltage than a voltage applied to the other of the terminals, the terminal having a higher voltage bias applied thereto will effectively be the drain terminal and the other of the two terminals having the lower voltage bias applied thereto will effectively be the source terminal, e.g., as would be appreciated by one skilled in the art after reading the present description. This, according to an example which is in no way intended to limit the invention, a high voltage bias may be applied to the source line to write a logical "1", while a high voltage bias may be applied to the bit line to write a logical "0".

It should be noted that although various approaches included herein describe writing a logical "1" and/or a logical "0" to a given cell of memory, these logical values are in no way intended to limit the invention. Rather, "1" and "0" are intended to represent a logical state that may be represented by any other form. In some instances, a memory controller may even be programmed such that the logical values (representations) behind "0" and "1" are reversed. Thus, various ones of the approaches described herein are in no way intended to be limiting in this manner.

Similarly, it should be noted that the use of "row(s)" and "column(s)" as used herein is in no way intended to be limiting. For instance, the distinction between a "row" and a "column" may merely depend on the frame of reference used. For example, should the MRAM array 300 in FIG. 3 be rotated 90 degrees, the columns 318 may actually be considered "rows", while the rows 320 may actually be considered as "columns". Thus, the various approaches described herein which rely on the difference between columns and rows are in no way intended to be limiting, e.g., as would be appreciated by one skilled in the art after reading the present description.

Further still, "high" and "low" voltages as used herein are in no way intended to be limiting. For instance, a "high voltage" is preferably a voltage which is at least higher than a "low voltage". Similarly, a "low voltage" is preferably a voltage which is at least lower than a "high voltage". The specific voltages used as the high and low voltages may vary depending on memory configurations, user preference and/or input, the type of transistor being used, etc.

Looking now to FIGS. 6A-6B, a MRAM array 600 is illustrated in accordance with one embodiment which is in no way intended to limit the invention. As an option, the present MRAM array 600 may be implemented in conjunction with features from any other embodiment listed herein, such as those described with reference to the other FIGS., e.g., such as FIGS. 1-5B. Of course, however, such MRAM array 600 and others presented herein may be used in various applications and/or in permutations which may or may not be specifically described in the illustrative embodiments listed herein. Further, the MRAM array 600 presented herein may be used in any desired environment.

Looking now to FIG. 6A, a portion of a MRAM cell 600 that includes a plurality of p-MTJs 612 is shown according to one embodiment. The MRAM cell 600 also includes a common bit line 616 that supplies current across the p-MTJs 612, e.g., from a current source (not shown). The common bit line 616 may include any suitable material known in the art, such as TaN, W, TiN, Au, Ag, Cu, etc. The p-MTJ extension layers 614 electrically connect each of the p-MTJs 612 with the common bit line 616. The extension layers 614 may include any suitable material known in the art, such as Ru, Ta, etc.

Moreover, a source line 606 is coupled between the p-MTJs 612 and a channel layer 610 through n+ common source layer 604, the channel layer 610 further being in electrical contact with a n+ common source layer 604. The channel layer 610 may include any suitable semiconductor material known in the art, such as Si, epi-Si, Ge, GaAs-compounds, etc. The n+ common source layer 604 may include any suitable material known in the art, such as phosphorous-doped silicon, arsenide-doped silicon, doped silicon cladded with TaN, W, TiN, Au, Ag, Cu, etc., and may be further electrically connected to a current source by a source line 606, which may include any suitable material known in the art, such as TaN, W, TiN, Au, Ag, Cu, etc. Positioned across the channel layer 610 is a common word line 608 which may include any suitable material known in the art, such as TaN, W, TiN, Au, Ag, Cu, etc. On either side of the n+ common source layer 604 are shallow trench isolation (STI) layers 602 which provide electrical insulation between adjacent n+ common source layers 604. Moreover, although not specifically shown, electrically insulative material may be positioned around the various layers shown in FIG. 6A, as would be understood by one of skill in the art.

It follows that the n+ common source layer 604 is shared across more than one of the cells (having at least a p-MTJ 612 included therein), thereby acting as a common source line as seen in the various approaches described herein. Thus, the source layer 604 contact may be shared for plural access transistors, thereby effectively allowing for the cell layout in the MRAM array 600 be increased significantly, especially compared to conventional products. Moreover, disturbances which may be caused by sharing a source contact among memory cells could be minimized by employing a protective bias scheme in memory array operation, e.g., on a circuit level. The overarching transistor included in each of the memory cells may preferably be a vertical transistor which has a general cylindrical shape, e.g., as will be described in further detail below.

Moreover, a source terminal 605 of a transistor is included between the p-MTJ 612 and the channel layer 610. In order to form a desirable terminal, the source terminal 605 preferably includes a material which has a substantial ohmic contact with target channel materials of the structure, which may include epi-Si, epi-SiGe, epi-Ge, nanocrystalline Si, laser-annealed recrystallized Si, etc. Accordingly, the source terminal 605 may include various silicide materials such as NiTi, TiSi, PtSi, CoSi or pure metallic component such as Ni, Ti, Au, Cr, Pt, etc. A drain terminal (not shown) of a vertical channel transistor may also be coupled to the n+ common source layer 604. Some approaches may further include multiple drain terminals connected to the n+ common source layer 604. Furthermore, in some approaches the common word line 608 may even function as a gate terminal of a transistor, e.g., as would be appreciated by one skilled in the art after reading the present description.

Looking specifically to FIG. 6B now, a top-down view of the MRAM array 600 included in FIG. 6A is illustrated. As shown, the common bit lines 616 run along the rows of memory cells, the rows being identified by the plurality of contact hole masks 624. Moreover, the contact hole masks 624 are also shown as being oriented in columns along the word line masks 618.

Source line masks 632 extend parallel to the word line masks 618 along the columns of memory cells, and include a plurality of source contact masks 630. The source contact masks 630 are also marked with an "X" to signify their location more precisely.

As mentioned above, the actual dimensions of the various components included in the top-down view of FIG. 6B may vary depending on the type of fabrication processes implemented when forming the MRAM array 600. Accordingly, the separation 620 between the common bit lines 616 may be about 1 F, while the width of the common bit lines 616 may also be about 1 F. Similarly, the spacing between each of the word line masks 618 may be about 1 F, while the width of each of the word line masks 618 themselves may be about 1.5 F. Again, "F" represents the minimum feature size defined by the lithography limits associated with the technology used to fabricate each of the components included in the MRAM array 600. Thus, depending on the actual process(es) used to form the common bit lines 616, and/or any of the other components included in MRAM array 600, the dimensions of the components may vary depending on the value of F. As a result, the architecture of the various layers included in each of the memory cells and the structure implemented to interconnect them allows the p-MTJ cells to be significantly smaller than conventionally achievable.

Now referring to FIG. 6C, a p-MTJ cell 650 is illustrated in accordance with one embodiment which is in no way intended to limit the invention. As an option, the present p-MTJ cell 650 may be implemented in conjunction with features from any other embodiment listed herein, such as those described with reference to the other FIGS., e.g., such as FIGS. 1-6B. Of course, however, such p-MTJ cell 650 and others presented herein may be used in various applications and/or in permutations which may or may not be specifically described in the illustrative embodiments listed herein. Further, the p-MTJ cell 650 presented herein may be used in any desired environment.

The p-MTJ cell 650 illustrated in the top-down view of FIG. 6C may be a vertical transistor. Moreover, the p-MTJ cell 650 is shown as being formed in a contact mask 652, e.g., as would be appreciated by one skilled in the art after reading the present description. As described above, vertical transistor effectively increases current-drivability without increasing silicon floor per access transistor. Moreover, vertical transistors may have a general cylindrical profile. That means that a vertical channel width of the p-MTJ cell 650 may be determined by $2*pi*r$, while conventional 2-D planar transistors have channel widths which are determined by $2*r$. It follows that implementing vertical transistors, e.g., such as that included in p-MTJ cell 650, various ones of the approaches included herein are effectively able to triple the current drivability. This is critical point in achieving compact bit-to-cell architecture in p-MTJ technology, which involves sufficiently large spin-torque currents for performing writing operations.

Accordingly, the circular shape represents the top of a general cylindrical shape that the p-MTJ cell 650 has (extending into and/or out of the page). A diameter D of a cross section of the general cylindrical shape may be about 11 nm, but could be greater or smaller depending on the desired approach. Accordingly, a surface area of a cross section of the cylindrically shaped portion of the p-MTJ cell 650 may be calculated as $2*\pi*r$, or equivalently $D*\pi$, which produces a surface area of about 33 $nm^2$, but could be greater or smaller depending on the actual diameter of the cylindrical structure.

It follows that various embodiments included herein are able to achieve data storage densities which are much higher than previously possible. By implementing p-MTJ cells having a common (e.g., shared) source line extending therebetween according to different approaches described herein, the resulting memory arrays may provide the desirable performance of MRAM in a configuration which is much more compact and effective than conventionally achievable.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems. One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product which includes a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof.

In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic device, comprising:
   a plurality of perpendicular magnetic tunnel junction (p-MTJ) cells, each p-MTJ cell having a transistor and a magnetic tunnel junction (MTJ) sensor, wherein each of the transistors includes a drain terminal, a source terminal, and a gate terminal, wherein each of the p-MTJ cells has a cylindrical shape;
   a first common word line coupled to the gate terminal of each transistor in a first subset of the plurality of p-MTJ cells;
   a first common bit line coupled to a first end of each MTJ sensor in a second subset of the plurality of p-MTJ cells, wherein a second end of each of the MTJ sensors in the second subset is coupled to the source terminal of each respective transistor in the second subset; and
   a first common source line coupled to the drain terminal of each transistor in the first subset.

2. The magnetic device as recited in claim 1, wherein an effective cell size of each of the p-MTJ cells is $5F^2$, wherein F is the minimum feature size associated with a technology used to fabricate each of the p-MTJ cells.

3. The magnetic device as recited in claim 1, wherein a diameter of each of the p-MTJ cells is about 11 nm.

4. The magnetic device as recited in claim 1, wherein the first subset of p-MTJ cells are oriented in a first column and the second subset of p-MTJ cells are oriented in a first row, wherein the first column extends perpendicular to the first row.

5. The magnetic device as recited in claim 4, wherein the first column and the first row intersect such that the first and second subsets of p-MTJ cells include a common p-MTJ cell.

6. The magnetic device as recited in claim 5, wherein each of the remaining p-MTJ cells in the first subset are also included in a respective row which intersects the first column, wherein each of the remaining p-MTJ cells in the second subset are also included in a respective column which intersects the first row.

7. The magnetic device as recited in claim 6, comprising: a common source line coupled to the drain terminal of each transistor in each of the respective columns which intersect the first row.

8. The magnetic device as recited in claim 7, comprising:
a sense amplifier coupled to each of the respective common source lines.

9. The magnetic device as recited in claim 1, comprising:
a voltage generating circuit coupled to the first common source line.

* * * * *